United States Patent
Schätzler et al.

(10) Patent No.: US 6,870,245 B1
(45) Date of Patent: Mar. 22, 2005

(54) ELECTRIC COMPONENT WITH AN INTEGRATED CIRCUIT MOUNTED ON AN ISLAND OF A LEAD FRAME

(75) Inventors: Bernhard Schätzler, Regensburg (DE); Georg Ernst, Thalmassing (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/688,465

(22) Filed: Oct. 16, 2000

Related U.S. Application Data

(62) Division of application No. 09/359,178, filed on Jul. 22, 1999, now abandoned, which is a continuation of application No. PCT/DE97/00105, filed on Jan. 22, 1997.

(51) Int. Cl.$^7$ .................. H01L 23/495; H01L 23/28
(52) U.S. Cl. .............. 257/669; 257/666; 257/676; 257/783; 257/787; 257/784
(58) Field of Search .................. 257/666, 669, 257/676, 787, 783, 667, 786

(56) References Cited

U.S. PATENT DOCUMENTS

| | | | |
|---|---|---|---|
| 4,258,381 A | | 3/1981 | Inaba |
| 4,534,105 A | * | 8/1985 | Reusch ................ 257/676 |
| 5,177,032 A | * | 1/1993 | Fogal et al. ........... 437/220 |
| 5,182,630 A | * | 1/1993 | Omi et al. ............ 257/767 |
| 5,355,017 A | * | 10/1994 | Nakamura et al. ...... 257/666 |
| 5,358,905 A | | 10/1994 | Chiu |
| 5,498,902 A | * | 3/1996 | Hara ................... 257/686 |
| 5,536,970 A | * | 7/1996 | Higashi et al. ......... 257/676 |
| 5,579,249 A | * | 11/1996 | Edwards .............. 364/578 |
| 5,773,878 A | * | 6/1998 | Lim et al. ............ 257/676 |
| 5,905,299 A | * | 5/1999 | Lacap ................. 257/666 |
| 6,307,755 B1 | * | 10/2001 | Williams et al. ....... 361/813 |

FOREIGN PATENT DOCUMENTS

| | | |
|---|---|---|
| DE | 36 35 375 A1 | 4/1988 |
| DE | 40 41 346 A1 | 6/1992 |
| DE | 195 26 010 A1 | 1/1997 |
| EP | 0 261 324 A1 | 3/1988 |
| JP | 60 119 756 | 6/1985 |
| JP | 60 189 956 | 9/1985 |
| JP | 61 032 435 | 2/1986 |
| JP | 04 101 437 | 4/1992 |
| JP | 07 038 040 | 2/1995 |

OTHER PUBLICATIONS

Electronic Packaging and Interconnection Handbook, C.A. Harper, New York, pp. 1.40,9.112,9.157.

* cited by examiner

*Primary Examiner*—Nitin Parekh
(74) *Attorney, Agent, or Firm*—Laurence A. Greenberg; Werner H. Stemer; Ralph E. Locher

(57) ABSTRACT

The invention relates to an electronic component having an integrated circuit being packaged in a housing. The electronic component is adhesively bonded to an island of a leadframe, the island being designed to accommodate the integrated circuit and being dimensionally adapted to the base surface of the integrated circuit in order to minimize and prevent housing deformations.

5 Claims, 1 Drawing Sheet

ELECTRIC COMPONENT WITH AN INTEGRATED CIRCUIT MOUNTED ON AN ISLAND OF A LEAD FRAME

CROSS-REFERENCE TO RELATED APPLICATION

This is a division of U.S. application Ser. No. 09/359,178, filed Jul. 22, 1999 now abandoned which was a continuation of copending International Application No. PCT/DE97/00105, filed Jan. 22, 1997, which designated the United States.

BACKGROUND OF THE INVENTION

Field of the Invention

The invention relates to an electronic component, in particular to thin QFPs, in which a standardized lead frame and an integrated circuit are used and embedded in a casting or molding compound.

Surface mounted electronic components, also called SMD components, are usually embedded in a housing made of a plastic molding compound, from which electronic terminals are led out. Depending on the number of terminals required, these housings correspond to a standard having defined dimensions to enable standardized production and automatic component-mounting of circuit boards. The dimensions of these housings are defined in German and International Standards. The lead frames, which are used for embedding the electrical terminals in an exactly positioned manner, are likewise standardized. An island is provided in the center of a lead frame and an integrated circuit is fixed on the island. A lead frame and an integrated circuit are then encapsulated together by molding them in a housing made of a molding compound. Stresses occur on account of the different expansion coefficients of the iron/nickel alloy usually used for the lead frame, of the silicon chip forming the integrated circuit, and of the molding compound of the housing. The occurrence of reaction shrinkage of the molding compound creates stresses as well. Consequently, diagonal housing warpage of up to 100 μm occurs particularly in the case of large flat housings (thin QFPs, also called TQFPs).

Attempts are made to prevent this housing flexure or warpage by using special island structures. In these cases, holes or slots are made in the islands, which are arranged centrally in the lead frames. Alternatively, the islands are undercut or furrows are etched into the islands. The use of copper lead frames has also already been attempted in order to minimize the housing warpage. However, all of these solutions require either new or changed mounting processes, or they can be implemented only with etched lead frames, not with stamped lead frames, or they lead to a reduction in the rigidity of the external terminals.

German published, non-prosecuted Patent Application DE 36 35 375 A1 discloses the use of a standardized lead frame. In this case, in order to adapt the carrier island to the semiconductor component, a corresponding carrier island is fixed on the central part of the frame.

In order to avoid flexure of a potted element, published European Patent Application EP 0 261 324 A1 discloses arranging the lead frame such that it is centered in height terms in the potting mold in order to ensure that the same amount of plastic reaches above and below the integrated circuit.

Patent Abstracts of Japan Publication No. 60189956 discloses adapting a lead frame configuration having a chip island on which a semiconductor chip is to be disposed to the size of the chip in such a way that the chip island is reduced to the size of the semiconductor chip by removing an edge.

U.S. Pat. No. 4,258,381 describes a lead frame configuration which is intended to be suitable for accommodating different chip sizes. The dimensions to be adhered to for the chip island are specified in this case.

SUMMARY OF THE INVENTION

It is accordingly an object of the invention to provide an electronic component, in particular to thin QFPS, in which a standardized lead frame and an integrated circuit are used and embedded in a casting or molding compound, which overcomes the above-mentioned disadvantages of the heretofore known methods and devices of this type, and which minimize flexure of the housing in a structurally simple manner.

With the foregoing and other objects in view there is provided, in accordance with the invention, a method for producing an electronic component, which includes the following steps: Producing a standardized lead frame having a predetermined number of leads that can be used with any one of a plurality of integrated circuits having different base areas. Producing the standardized lead frame with a central island having a predetermined maximum base area for supporting any one of the plurality of integrated circuits. Selecting one of the plurality of integrated circuits. Reducing the base area of the island, in accordance with a base area of the selected integrated circuit to obtain a ratio between the base area of the selected integrated circuit and the base area of the island from 0.7 to 0.9. Fixing the selected integrated circuit on the island, and embedding the selected integrated circuit and the island in a casting or molding compound so that a unit formed by the selected integrated circuit and the island is substantially vertically centered within the casting or molding compound. An overhang of the island beyond the base area of the integrated circuit, which would result in asymmetry in the distribution of the molding compound, is avoided in this case to the greatest possible extent. What is achieved by this construction is that during the occurrence of reaction shrinkage of the molding compound, at the periphery of the integrated circuit, between the edge thereof and the island edge, stresses which lead to warpage of the housing do not occur. The adaptation of the island expediently takes place after the production of the standard lead frames, because then a completely standardized lead frame can be used. Alternatively, the process for adapting the size of the island may be integrated in the actual process for producing the lead frame. In that case, however, it is necessary to produce different lead frames with island sizes that are adapted to the respective size of the integrated circuit. The tools for producing the lead frame are constructed modularly in order to enable the island size to be adapted in a simple manner.

In accordance with an added feature of the invention, the provided method includes performing the steps of producing the standardized lead frame using a stamping process. The lead frame is preferably stamped with the island integrally formed in it, in order to bring the island to the desired size. As an alternative, it is also possible to process the lead frame and the island using etching processes.

In accordance with an additional feature of the invention, the selected integrated circuit is preferably fixed on the island by bonding using a silver conductive adhesive.

In accordance with another feature of the invention, the provided method includes using an adhesive to perform the step of fixing the selected integrated circuit on the island, and monitoring the adhesive emerging from between the selected integrated circuit and the island to determine the quality of the fixation between the selected integrated circuit and the island. The base area of the island is usually reduced to a size that is still slightly larger than the base area of the integrated circuit so that the emerging adhesive can flow onto the edges of the island or the island overhang. A hollow groove is formed in the region of the island overhang and can readily be monitored visually.

With the objects of the invention in view, there is additionally provided an electronic component that includes a housing made of a casting or a molding compound, an integrated circuit having a base area, and a lead frame having a central island with a base area supporting the integrated circuit. The ratio between the base area of the integrated circuit and the base area of the island is from 0.7 to 0.9 for avoiding flexure of the housing. The integrated circuit and the island are embedded in the housing so that a thickness of a housing region above the integrated circuit is substantially equal to a thickness of a housing region below the island. This electronic component is distinguished by the fact that the island terminates essentially flush with the integrated circuit, and that the distance between the top side of the housing and the top side of the integrated circuit corresponds to the distance between the underside of the housing and the underside of the island. If the island is larger than the integrated circuit that is fixed on it, then the result is a different molding compound thickness between the top side of the island and the top side of the housing and the underside of the island and the underside of the housing, in the region of the island overhang. This difference in thickness, in interaction with the rigid lead frame made of a special metal alloy, causes stresses in the housing which result in the warpage of the housing. Given otherwise identical materials, manufacturing equipment, processes and process parameters, the ratio of the base area of the integrated circuit to the base area of the island, alone, determines the degree of warpage of the housing. The stresses between the integrated circuit, lead frame, and molding compound are balanced by adapting the base area of the island to the respective base area of the integrated circuit in such a way that the warpage of the housing is reduced or eliminated, depending on the ratio of the areas to one another. In order to attain particularly good minimization of the warpage of the housing, the island can be constructed so that it terminates flush with the placed integrated circuit. In that case, the island and the integrated circuit therefore have exactly the same size or base areas. As a result, the molding compound thickness between the top side of the integrated circuit and the top side or edge of the housing and the underside of the island and the bottom side or edge of the housing are identical at all points in the housing and the stresses compensate for one another. The bimetal effect resulting from the different expansion coefficients is avoided due to the symmetrical construction.

In accordance with an added mode of the invention, the electronic component includes an adhesive, bonding the integrated circuit to the island, and a hollow groove that is formed on the integrated circuit by an amount of adhesive that has emerged from between the integrated circuit and the island. Because the base area of the island has been constructed somewhat larger than the integrated circuit, the emerging adhesive forms a hollow groove on the overhanging edge of the island. The formation of this groove makes it possible to monitor whether or not the integrated circuit is correctly bonded on the island. It is particularly expedient in this case to construct the island in such a way that the ratio of the base area of the integrated circuit to the base area of the island is less than 0.9:1.0.

In accordance with an additional mode of the invention, the base area of the island is constructed as a continuous, unpatterned area. This ensures that the thickness of the molding compound above and below the integrated circuit and the island is identical. In addition, the prior-art patterning and special structures of the island are obviated.

In accordance with another mode of the invention, the lead frame includes leads that are routed up to the island. This is advantageous particularly in the case of very small integrated circuits, in which an excessively large distance between the leads and the island would be produced and problems might arise in the course of further contact-making.

In accordance with a further mode of the invention, the lead frame includes leads that are vertically centered within the housing, and the island is vertically lowered with respect to the leads.

In accordance with a concomitant mode of the invention, an electronic component is provided that includes a housing made of casting or molding compound, an integrated circuit having a base area, and a lead frame having an island with a base area supporting the integrated circuit. The base area of the island is greater than the base area of the integrated circuit for avoiding flexure of the housing. The integrated circuit and the island are embedded in the housing so that a thickness of a housing region above the integrated circuit is substantially equal to a thickness of a housing region below the island.

Other features which are considered as characteristic for the invention are set forth in the appended claims.

Although the invention is illustrated and described herein as embodied as an electronic component with an integrated circuit mounted on an island of a lead frame and a method for producing the electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
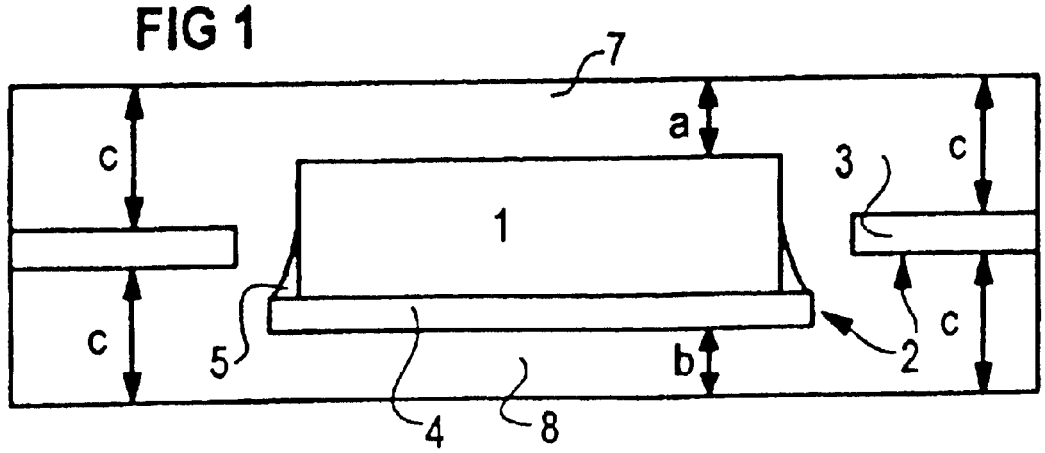
FIG. 1 is a diagrammatic lateral-sectional view of a component according to the invention with a large integrated circuit.

Referring now to the features of the drawings in detail and first, particularly, to FIG. 1 thereof, there is seen a cross section through an electronic component with a lead frame 2, that includes leads 3 and an island 4. An integrated circuit 1 is fixed on the island 4, and the lead frame 2 and the integrated circuit 1 are then embedded in a housing 6 made of molding compound. The integrated circuit 1 and the island 4 are vertically disposed to produce housing regions 7 and 8 respectively having a thickness a and b, that are identical. The size of the island 4 has been adapted, in accordance with the invention, to the base area of the integrated circuit 1, with the result that these essentially correspond. The island 4 is larger than the base area of the integrated circuit 1 merely by a small overhang, with the result that the adhesive used to fix the integrated circuit 1 on the island 4 can escape and form a hollow groove 5 on the overhang. This hollow groove 5 forms a suitable monitoring parameter for monitoring optimum bonding of the integrated circuit 1 to the island 4. The whole lead frame 2 is vertically disposed so that the leads 3 are likewise vertically centered in the housing 6. Therefore, housing regions having the same thickness, which are designated by reference symbol c in FIG. 1, extend above and below the leads 3. The island 4 is lowered relative to the leads 3, in accordance with the height of the integrated circuit 1 so that the combined height of the integrated circuit 1 and the island 4 will be vertically centered within the housing 6. This height adaptation is to be taken into account during the production of the lead frame 2 and the connections between the leads 3 and the island 4.

Figure 2:
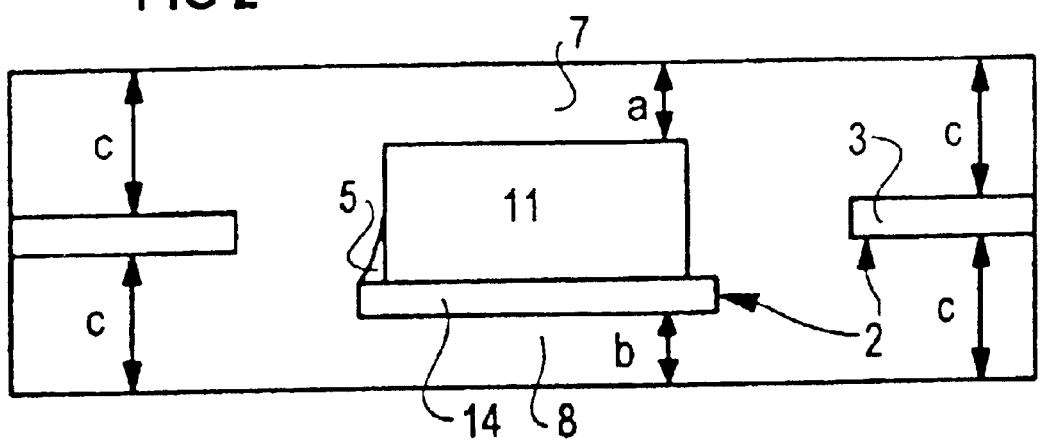
FIG. 2 is a lateral-sectional view through a component iii according to the invention with a small integrated circuit.

FIG. 2 illustrates an electronic component according to the invention with a small integrated circuit 11. For this purpose, the island 14 is adapted in accordance with the smaller integrated circuit 11 and is accordingly constructed to be smaller. A suitable ratio of the base area of the integrated circuit 11 to the base area of the island 14 lies between 0.7 and 0.9, as can be gathered from Table I.

In experiments with various TQFP 20×20×1.4 mm housings, alloy-42 lead frame and Aratronic 2188 molding compound, the following relationships were determined.

TABLE I

| Island size in mm × mm | Chip area/island area ratio (average value) | Housing warpage diagonal |
| --- | --- | --- |
| 13.8 × 13.8 | 0.7 | <80 μm |
| 13.8 × 13.8 | 0.8 | <60 μm |
| 13.8 × 13.8 | 0.9 | <20 μm |
| 11.6 × 11.6 | 0.6 | >70 μm |
| 9.4 × 9.4 | 0.6 | >80 μm |
| 9.4 × 9.4 | 0.9 | <30 μm |

Within the lead frame 2, the island 14 is lowered relative to the leads 3 so that housing regions having the same thickness c are produced both above and below the leads 3, and so that housing region 7 having the thickness a and housing region 8 having the thickness b substantially equal to thickness a are respectively produced above and below the combination of the integrated circuit 11 and the island 14. In this exemplary embodiment, a small overhang of the island 14, at which stresses occur due to the reaction shrinkage of the molding compound, is accepted so that a hollow groove 5 can be produced on the island overhang. The hollow groove serves as an important monitoring parameter during production.

Figure 3:
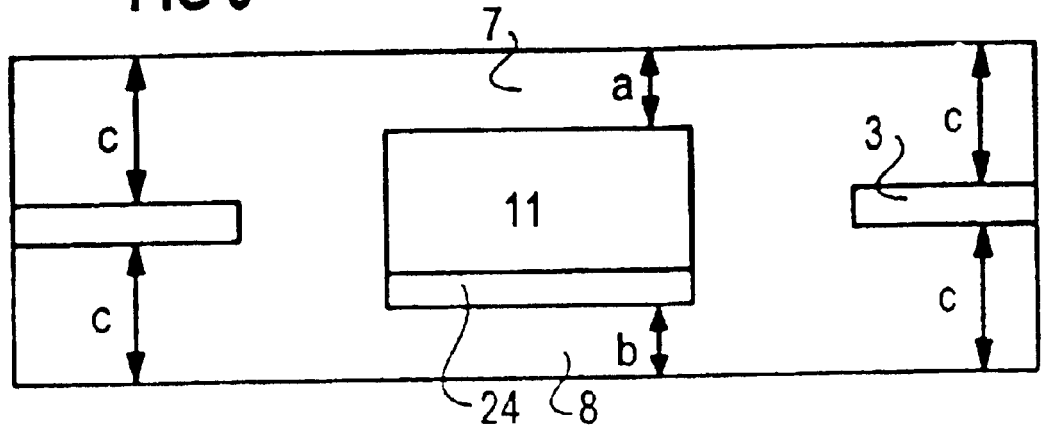
FIG. 3 is a lateral-sectional view through a component according to the invention with a small integrated circuit and an island that terminates flush with the integrated circuit.

Another embodiment of the invention is shown in FIG. 3, which illustrates a small integrated circuit 11 with an island 24 that terminates flush with the integrated circuit 11. Overhanging island regions at which stresses could occur due to the reaction shrinkage of the molding compound are not present at all in this embodiment.

The figures merely illustrate integrated circuits 1 and 11 having two different sizes. It goes without saying, however, that a whole group of integrated circuits of different sizes can be used with a standardized housing 6. The size of the island 4 is adapted in accordance with the size of the base area of a selected integrated circuit, in such a way that the standard lead frame 2 is processed further in accordance with the invention and can be used for a whole group of different integrated circuits, without warpage of the housing 6 occurring. The housings 6 described above are large thin square housings, so-called TQFPs, having 176 leads, for example, that are led out from the square housing on all four sides.

We claim:

1. An electronic component, comprising:

a thin quad flat package including:

a housing made of a casting or a molding compound;

an integrated circuit having a base area; and a lead frame having an island with a base area supporting said integrated circuit, the integrated circuit being adhesively bonded such that the adhesive emerges from the base area of the island along at least one edge of the island a ratio between the base area of said integrated circuit and the base area of said island being from 0.7 to 0.9 for avoiding flexure of said housing;

said integrated circuit and said island embedded in said housing so that a thickness of a housing region above said integrated circuit is substantially equal to a thickness of a housing region below said island.

2. The electronic component according to claim 1, including an adhesive bonding said integrated circuit to said island, and a hollow groove formed on said integrated circuit by an amount of adhesive that has emerged from between said integrated circuit and said island.

3. The electronic component according to claim 1, wherein the base area of said island is a continuous, unpatterned area.

4. The electronic component according to claim 1, wherein said lead frame includes leads that are routed to said island.

5. The electronic component according to claim 1, wherein said lead frame includes leads that are vertically centered within said housing, and said island is vertically lowered with respect to said leads.

* * * * *